United States Patent
Fujimura

(10) Patent No.: US 8,203,883 B2
(45) Date of Patent: Jun. 19, 2012

(54) SEMICONDUCTOR MEMORY DEVICE AND METHOD OF PROGRAMMING THE SAME

(75) Inventor: Susumu Fujimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 12/828,689

(22) Filed: Jul. 1, 2010

(65) Prior Publication Data
US 2011/0058423 A1 Mar. 10, 2011

(30) Foreign Application Priority Data
Sep. 10, 2009 (JP) .................. 2009-209569

(51) Int. Cl.
*G11C 16/04* (2006.01)
(52) U.S. Cl. .................. 365/185.17; 365/185.18
(58) Field of Classification Search ............ 365/185.15, 365/185.18
See application file for complete search history.

(56) References Cited

U.S. PATENT DOCUMENTS

| | | | |
|---|---|---|---|
| 2002/0114188 A1* | 8/2002 | Lee | 365/185.18 |
| 2007/0025152 A1* | 2/2007 | Futatsuyama | 365/185.17 |
| 2008/0049511 A1* | 2/2008 | Crippa et al. | 365/185.19 |
| 2009/0073775 A1* | 3/2009 | Lee | 365/185.25 |

FOREIGN PATENT DOCUMENTS

| | | |
|---|---|---|
| JP | 7-169285 | 7/1995 |
| JP | 2001-332093 | 11/2001 |
| JP | 2009-037676 | 2/2009 |
| JP | 2009-064516 | 3/2009 |
| JP | 2009-70461 | 4/2009 |
| JP | 2011-521398 | 7/2011 |

OTHER PUBLICATIONS

Japanese Office Action issued Dec. 27, 2011 in Patent Application No. 2009-209569 with English translation.

* cited by examiner

*Primary Examiner* — Anh Phung
(74) *Attorney, Agent, or Firm* — Oblon, Spivak, McClelland, Maier & Neustadt, L.L.P.

(57) ABSTRACT

In an embodiment, a semiconductor memory device including a cell array with NAND strings arranged therein, wherein the device has such a program mode that bit lines and cell's channels of the NAND strings coupled thereto are initially charged in accordance with program data, and then program voltage is applied to memory cells selected in the cell array. In the program mode, a certain bit line and a program-inhibited cell's channel coupled thereto, which are initially charged to Vdd, are boosted to be higher than Vdd by capacitive coupling from the cell source line prior to the program voltage application.

12 Claims, 9 Drawing Sheets

FIG. 4

| BL Capacitance | BL-Biased State | Coupling Ratio | BL-Floating State | Coupling Ratio |
|---|---|---|---|---|
| Between Just Neighboring BLs | 1.200[pF] | 82% | 0.000[pF] | 0% |
| Between Neighboring-Neighboring BLs | 0.040[pF] | 3% | 0.000[pF] | 0% |
| Between Other BLs | 0.150[pF] | 10% | 0.150[pF] | 65% |
| Against CELSRC | 0.080[pF] | 5% | 0.080[pF] | 35% |
| Total | 1.470[pF] | | 0.230[pF] | |

SEMICONDUCTOR MEMORY DEVICE AND METHOD OF PROGRAMMING THE SAME

CROSS-REFERENCE TO RELATED APPLICATION

This application is based on and claims the benefit of priority from the prior Japanese Patent Application No. 2009-209569, filed on Sep. 10, 2009, the entire contents of which are incorporated herein by reference.

FIELD

Embodiments described herein relate generally to a semiconductor memory device with a non-volatile semiconductor memory cell array and a method of programming the same.

BACKGROUND

A NAND-type of flash memory is well-known as an electrically rewritable and nonvolatile semiconductor memory device. The demands for the NAND-type of flash memories are increased more and more in accordance with the capacity increase and the multi-level storage scheme installed.

Data program (or write) of the NAND-type flash memory is performed in such a manner as to apply program voltage to a selected word line, thereby injecting electrons into the floating gate of a selected cell (i.e., "0"-program cell) from the cell channel. In accordance with the electron injection, the selected cell's threshold voltage becomes high in the positive direction.

In the data program sequence, one page data are programmed simultaneously. In a "1"-program cell (i.e., program-inhibited cell), in which the threshold voltage is not to be increased, the cell channel is preliminary set in a floating state and boosted in potential by capacitive coupling from the word lines when applying the program voltage, so that electron injection into the floating gate may be prevented. Therefore, at the beginning of the program sequence, it is in need of initially charging-up the one page cell's channels by use of bit line voltage control.

In detail, the initial charging of the cell's channels is performed as follows: "1"-program cell's channel is charged-up to the power supply voltage "Vdd" via a bit line, and set in a floating state; and "0"-program cell's channel is set at the ground voltage "Vss" via another bit line. According to this initial charging operation for the bit lines and cell's channels coupled thereto, when applying a program voltage and a program-pass voltage to the selected word line and non-selected word lines, respectively, it is executed such a program control that electron injection occurs in the "0"-program cell because large voltage is applied between the floating gate and the cell channel while electron injection does not occur in the "1"-program cell because the cell channel is boosted in potential by capacitive coupling from the word lines.

In order to prevent "1"-program cells and non-selected cells from being erroneously programmed, it is material to efficiently boost the cell's channels. Therefore, there have been provided various kinds of self-boost technologies (for example, refer to Japanese Patent Application Publication No. P2009-70461A).

In a product with the power supply voltage of about Vdd=2.5V, it is sufficiently able to do the initial cell's channel charging operation at the beginning of the program sequence. However, in a low power supply voltage case such as Vdd=1.8V (for example, in case of a mobile product), the initially charged cell's channel stays at 1.8V, and it is insufficient to boost the cell channel efficiently. This causes the memory device to be program-disturbed.

Even if the power supply voltage is low, preparing a boost circuit, it becomes possible to boost efficiently the cell's channel. However, in a flash memory having a large page length, for example, of 2 kByte, the total bit line capacitance for one page cells to be programmed simultaneously becomes, for example, 3 nF. Therefore, the boost circuit area necessary for charging-up the bit lines becomes large, and the power consumption also becomes large.

In the above-described Japanese Patent Application Publication No. P2009-70461A, there is disclosed a method for efficiently channel-boosting, in which a selected bit line preset at Vdd is boosted by capacitive coupling from the p-type well, non-selected bit lines and the cell source line.

BRIEF DESCRIPTION OF THE DRAWINGS

FIG. 4 shows the bit line capacitance distributions in the biased state and the floating state.

DETAILED DESCRIPTION

In an embodiment, a semiconductor memory device including a cell array with NAND strings arranged therein, one ends of the NAND strings being coupled to bit lines while the other ends are coupled in common to a cell source line, each NAND string having electrically rewritable and non-volatile memory cells connected in series, wherein the semiconductor memory device has such a program mode that the bit lines and cell's channels of the NAND strings coupled thereto are initially charged in accordance with program data, and then program voltage is applied to the memory cells selected in the cell array, and wherein in the program mode, a certain bit line and a program-inhibited cell's channel coupled thereto, which are initially charged to the power supply voltage, are boosted to be higher than the power supply voltage by capacitive coupling from the cell source line prior to the program voltage application.

Illustrative embodiments of this invention will be explained with reference to the accompanying drawings below.

Figure 1:
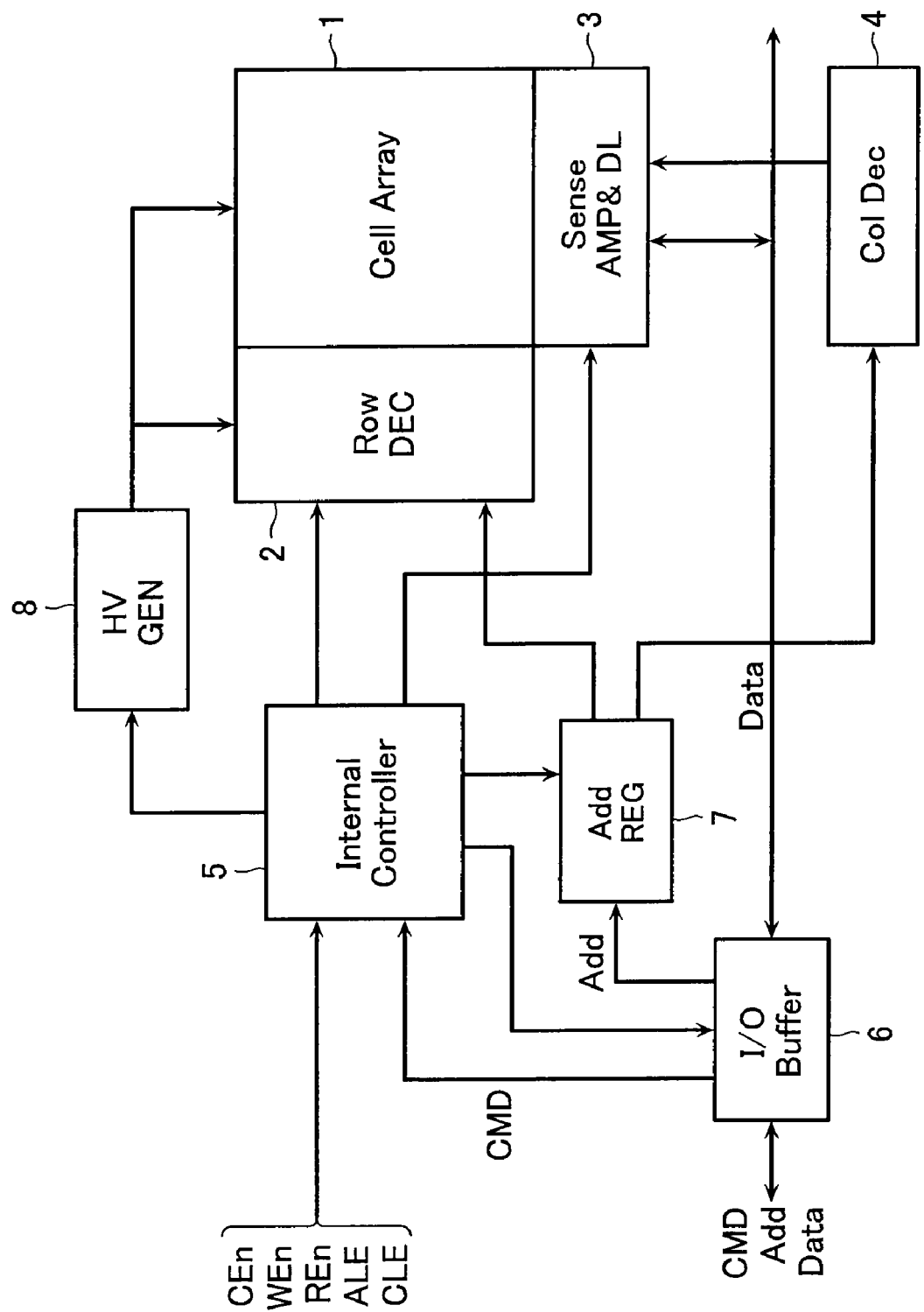
FIG. 1 shows a block configuration of a NAND-type of flash memory in accordance with an embodiment of the present invention.
Figure 2:
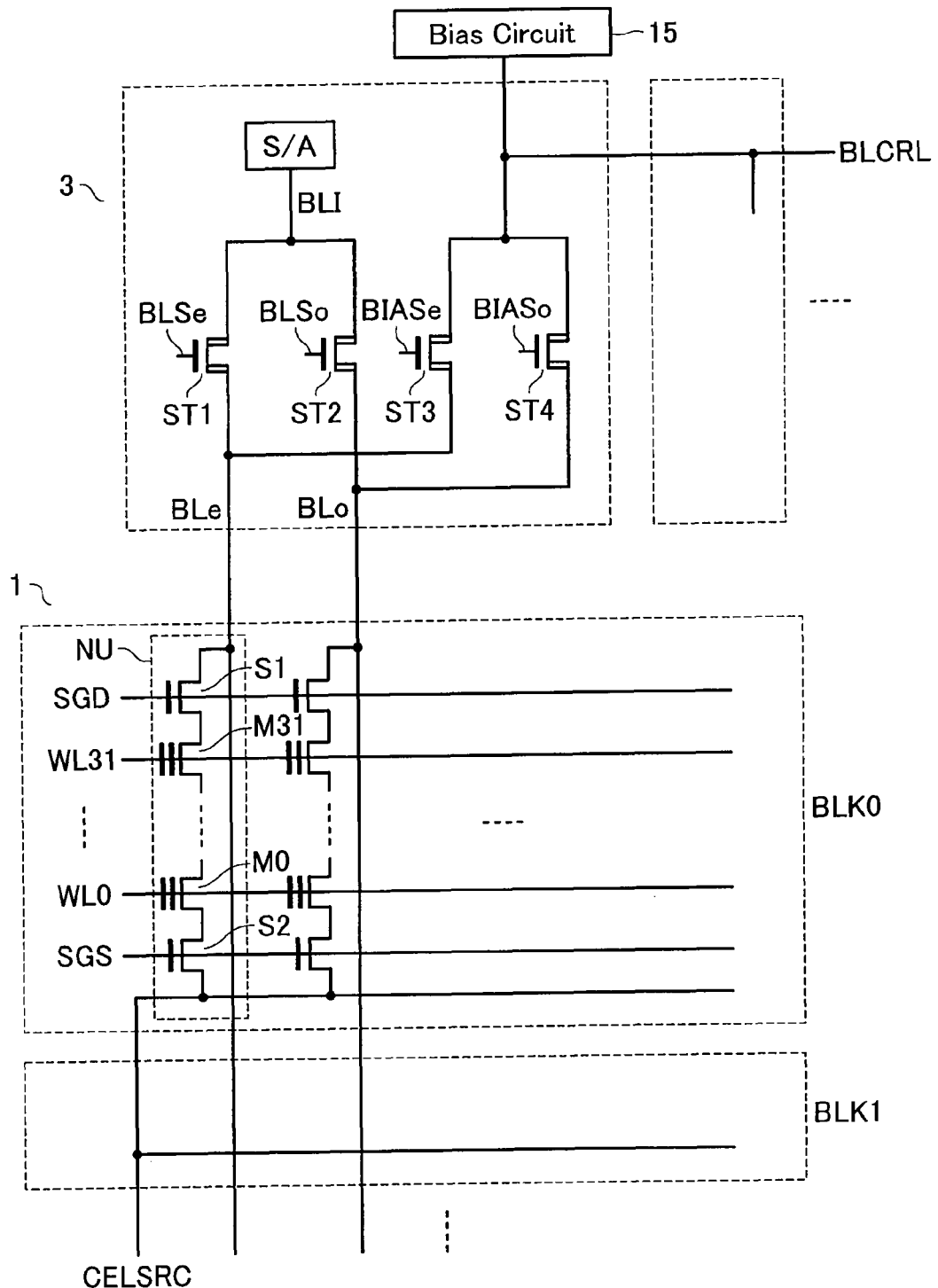
FIG. 2 shows the cell array of the flash memory.

FIG. 1 shows a schematic configuration of a NAND-type flash memory in accordance with an embodiment; and FIG. 2 shows an equivalent circuit of the memory cell array 1. NAND cell unit (i.e., NAND string), NU, which is a basic unit of the NAND-type flash memory, includes multiple memory cells M0-M31 connected in series and two select gate transistors S1 and S2 disposed at the both ends of the memory cells.

One end of the NAND string NU is coupled to bit line BL (i.e., BLe or BLo) via select gate transistor S1; and the other end to cell source line CELSRC, i.e., a common source line of the memory cell array 1, via select gate transistor S2.

The memory cell is an electrically rewritable and nonvolatile one. For example, the memory cell is a MOS transistor, which includes N-type source and drain layers and a stacked gate formed on the cell channel region with a floating gate and a control gate stacked. The floating gate is a charge storing layer. Changing the charge quantity of the floating gate in accordance with program operation or erase operation, the threshold voltage of the memory cell may be controlled, and data defined by the threshold voltage will be stored in a nonvolatile manner.

Controls gates of the memory cells in the NAND string NU are coupled to different word lines WL0-WL31 while gates of the select gate transistors S1 and S2 are coupled to select gate lines SGD and SGS, respectively.

A set of NAND strings NU sharing word lines WL0-WL31 and select gate lines SGD and SGS constitute a block BLK serving as an erase unit, in which the entire memory cells are to be erased in a lump. Usually as shown in FIG. 2, multiple blocks BLK (BLK0, BLK1, . . . ) are arranged in the bit line direction.

Row decoder 2 is prepared to select a block and selectively drive word lines WL0-WL31 and select gate lines SGD and SGS in the selected block in accordance with address input.

Sense amplifier circuit 3 contains sense amplifiers S/A covering one page data. That is, one page of read data or program data are transferred in a lump between the sense amplifier circuit 3 and the memory cell array 1.

Column decoder 4 is prepared to select read or program data column by column. As a result, one page read/write data, Data, are serially transferred between sense amplifier circuit 3 and the external data terminal I/O.

Various kinds of operations in this NAND-type flash memory may be executed in receipt of commands CMD. Command CMD is input to the internal controller 5 via I/O buffer 6 to be decoded, and serves for controlling the memory operations.

The internal controller 5 receives external control signals (chip enable CEn, write enable WEn, read enable REn, address latch enable ALE, command latch enable CLE and the like) and command CMD supplied from the input/output terminals I/O to execute the internal operation controls of data write, read and erase.

Address, Add, is taken into address register 7 via I/O buffer 6 and then transferred to the row decoder 2 and column decoder 4, thereby serving for address-selecting.

High voltage generation circuit 8 is controlled by the internal controller 5 to generate various high voltages (i.e., boosted voltages) to be used in the row decoder 2 and sense amplifier circuit 3 such as program voltage, program-pass voltage, read-pass voltage and the like.

FIG. 2 shows a sense amplifier scheme, in which adjacent two bit lines, i.e., even-numbered bit line BLe and odd-numbered bit line BLo share a sense amplifier S/A. In a read or write mode, either one of even bit line BLe and odd bit line BLo is selected by select transistors ST1 and ST2 driven by select signal BLSe and BLSo, respectively, to be coupled to the sense amplifier S/A.

At this time, non-selected bit line is coupled to a voltage supply node BLCRL via one of select transistors ST3 and ST4 driven by bias selecting signals BIASe and BIASo, respectively. Coupled to the voltage supply node BLCRL is a bias circuit 15, which is prepared to supply a bias voltage to the non-selected bit lines.

In the program mode, the bias circuit 15 becomes on, and one of the select signals BIASe and BIASo is set at Vreadh while the other is set at Vss, so that the bias circuit 15 supplies Vdd to the non-selected bit lines. As a result, the non-selected bit lines serve as shield lines each disposed between selected bit lines. Select transistors ST1-ST4 are formed as high breakdown voltage transistors.

In this sense amplifier scheme, memory cells selected by one word line and all even-numbered bit lines BLe constitute one page (i.e., even page) serving as a simultaneously programmed or read unit; and memory cells selected by one word line and all odd-numbered bit lines BLo constitute another page (i.e., odd page) serving as another simultaneously programmed or read unit.

Figure 3:
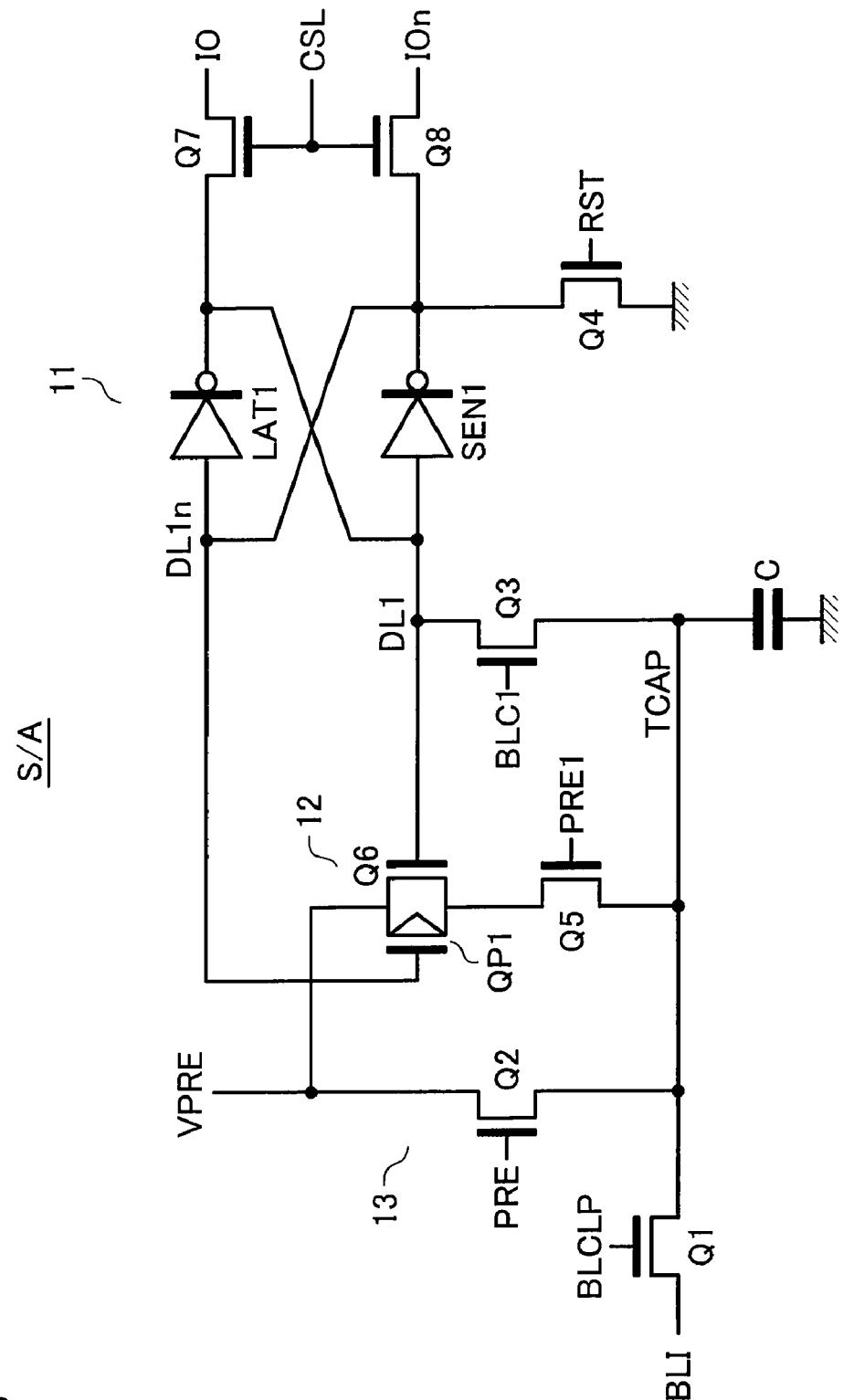
FIG. 3 shows the sense amplifier circuit of the flash memory.

FIG. 3 shows an example of the sense amplifier S/A. TCAP is a sense node, which is coupled to common bit line node BLI disposed in common to a pair of even- and odd-numbered bit lines via clamping NMOS transistor Q1.

Sense node TCAP, which is grounded via capacitor C, is coupled to data node DL1 of data latch 11 via transferring NMOS transistor Q3. Data latch 11 is formed of a pair of clocked inverters, input/output nodes of which are cross-coupled, for storing program or read data.

Data nodes DL1 and DL1n are coupled to data lines IO and Ion via NMOS transistors Q7 and Q8, respectively, which are driven by column select signal CSL. Data node DL1n is coupled to reset-use NMOS transistor Q4.

Further coupled to the sense node TCAP is the source of precharge NMOS transistor Q2, the drain of which is coupled to voltage supply node VPRE. This NMOS transistor Q2 constitutes a precharge circuit 13, which is adapted for precharging the bit lines in a read mode.

Disposed between the voltage supply node VPRE and sense node TCAP are a CMOS switch and NMOS transistor Q5 connected in series. The CMOS switch is formed of PMOS transistor QP1 and NMOS transistor Q6 connected in parallel to be driven by data nodes DL1n and DL1, respectively. NMOS transistor Q5 is driven by control signal PRE1. This CMOS switch and NMOS transistor Q5 constitute a write back circuit 12 used for rewriting the data held in the data latch 11.

Figure 5:
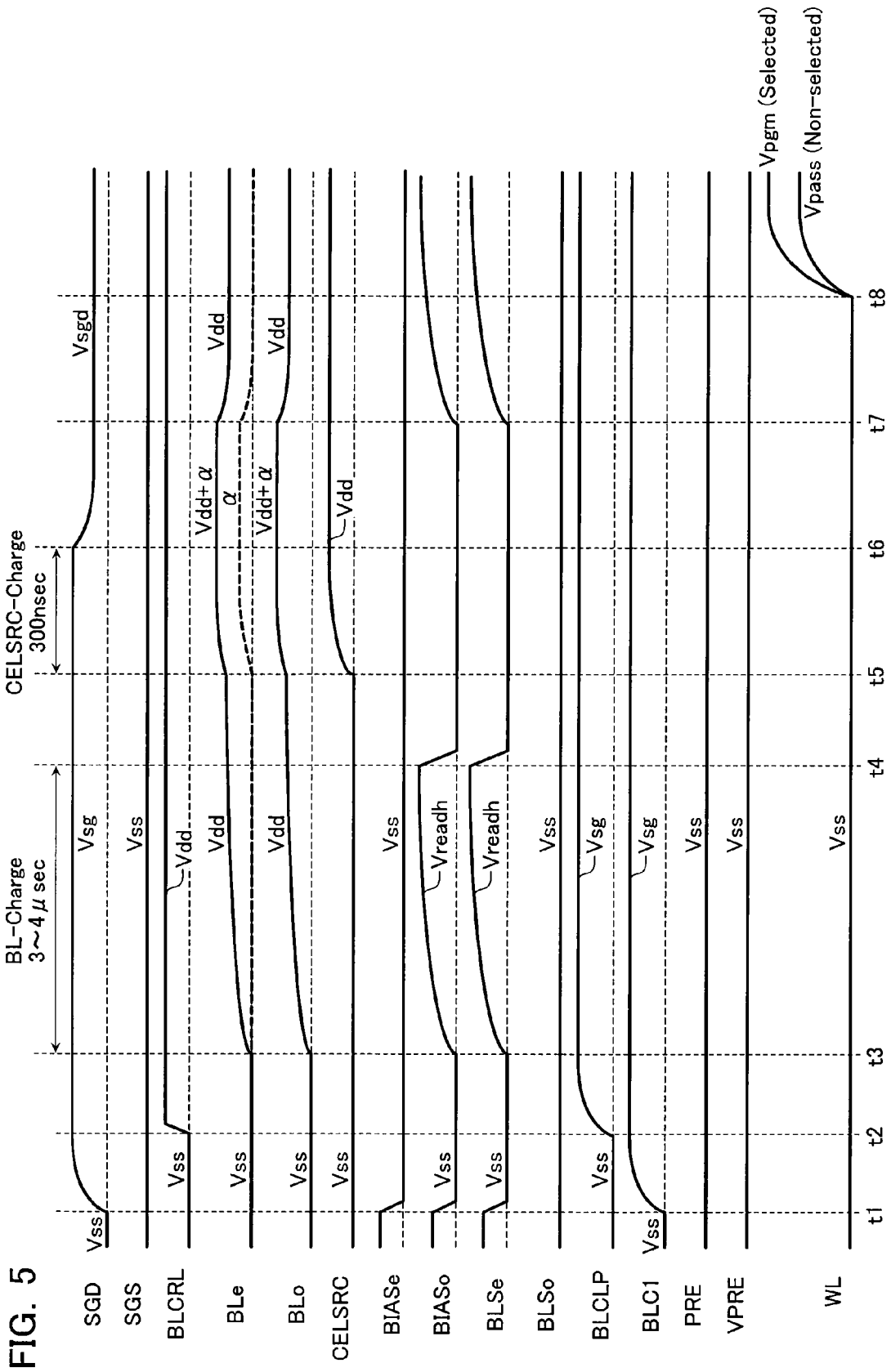
FIG. 5 shows the initial cell channel charging operation in the program sequence of the flash memory.
Figure 6:
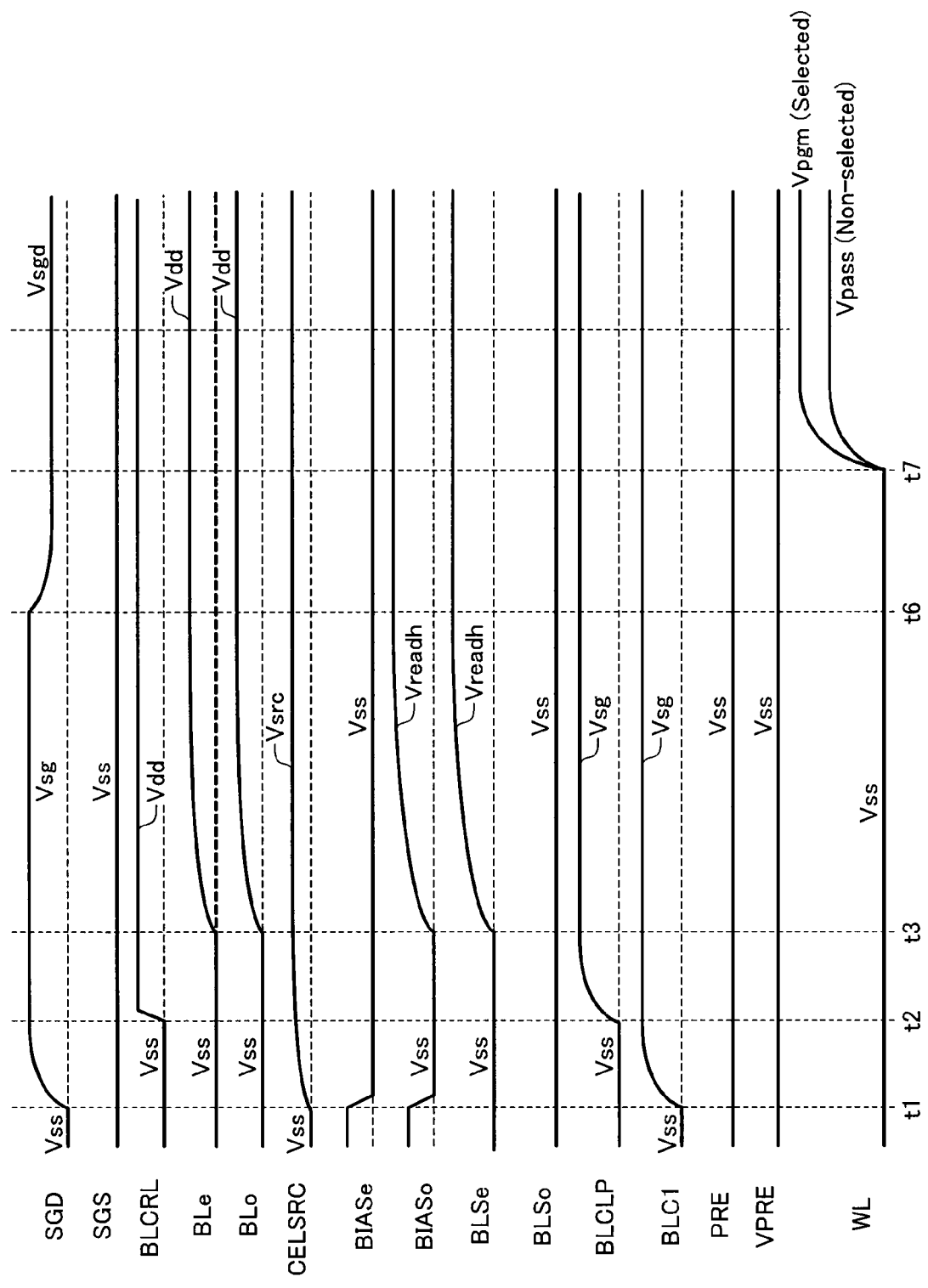
FIG. 6 shows the operation timing chart in the prior art.

In this embodiment, to effectively charge-up cell's channels coupled to selected bit lines in the program sequence, an improved initial charging scheme is used. FIG. 5 is a timing chart showing the cell's channel initial charging operation in this embodiment. FIG. 6 is another timing chart showing a conventional cell's channel initial charging operation as compared with that shown in FIG. 5.

The conventional cell's channel initial charging scheme will be explained preliminarily with reference to FIG. 6 for clearing the features of this embodiment. At timing t1, bit line side select gate line SGD in a selected block is raised to Vsg (where, Vsg is a voltage that is able to transfer Vdd without threshold voltage (Vth) drop). Simultaneously, transfer signal BLC1 is set at Vsg, so that program data in the data latch 11 in the sense amplifier S/A is transferred to sense node TCAP. In detail, Vss is transferred to sense node in case of "0"-program data while Vdd is transferred to sense node TCAP in case of "1"-program data. Cell source line CELSRC is applied with Vsrc for preventing the source line side select gate transistor S2 from being leaky.

At timing t2, to bias non-selected bit lines, bias circuit 15 is turned on to output the power supply voltage Vdd to the node BLCRL, and clamping transistor Q1 is turned on simultaneously with BLCLP=Vsg.

At timing t3, raise select signals BLSe and BIASo, and start the bit line charging operation. Non-selected bit lines, BLo, are charged up to Vdd via select gate transistor ST4 driven by BIASo=Vreadh (where, Vreadh is a voltage able to transfer Vdd without Vth drop). Selected bit lines, BLe, are biased in accordance with program data. That is, a "1"-program bit line (the solid bit line BLe in FIG. 6, to which "1" data is supplied) is set at Vdd while a "0"-program bit line (the dotted bit line BLe in FIG. 6, to which "0" data is supplied) is set at Vss. At this time, NAND cell's channels in the selected block, which are coupled to the bit lines, are set at Vdd and Vss correspondingly to the "1"-program bit line and "0"-program bit line, respectively.

At timing t6, the select gate line SGD is set at Vsgd slightly lower than Vsg. As a result, "1"-program cell's channels are isolated from the bit lines to be set in a Vdd floating state.

In this state, data program is executed under the condition that a selected word line is applied with boosted program voltage Vpgm and non-selected word lines are applied with program-pass voltage Vpass(<Vpgm) at timing t7. In each "0"-program cell, the cell's channel of which is set at Vss, a large voltage is applied between the floating gate and the cell's channel, and electrons are injected into the floating gate, so that the cell's threshold voltage will be increased. By contrast, in each "1"-program cell (i.e., program-inhibited cell), the cell's channel of which is set in the Vdd floating state, the floating cell's channel is boosted by capacitive coupling from the word lines, so that electrons are not injected into the floating gate.

The detailed explanation is omitted here, but it should be noted that various channel boost schemes have been provided for performing an effective channel-boost operation, preventing "1"-program cells and non-selected cells from being erroneously programmed.

In the conventional cell's channel initial charging operation, as described above, in case the power supply voltage is low such as Vdd=1.8V, the initially charged cell's channel stays at 1.8V, and there is a fear that the cell's channel is not boosted sufficiently.

In consideration of the conventional scheme, in this embodiment, a "1"-program bit line (i.e., program-inhibited bit line) is set once in a floating state after the initial charge-up to Vdd, and then the cell source line CELSRC is applied with, for example, Vdd. As a result, the program-inhibited bit line and cell's channel coupled thereto are boosted to Vdd+α by capacitive coupling from the cell source line CELSRC.

The cell's channel initial charging scheme in accordance with this embodiment will be explained with reference to FIG. 5. Operations from timing t1 to timing t3 are about the same as those explained in FIG. 6 excepting that cell source line CELSRC is kept at Vss.

That is, at timing t1, bit line side select gate line SGD in a selected block is raised to Vsg (where, Vsg is a voltage that is able to transfer Vdd without threshold voltage (Vth) drop). Simultaneously, transfer signal BLC1 is set at Vsg, so that program data in the data latch 11 is transferred to sense node TCAP. In detail, Vss is transferred to sense node TCAP in case of "0"-program data while Vdd is transferred to sense node TCAP in case of "1"-program data. Cell source line CELSRC is kept at Vss.

At timing t2, to bias non-selected bit lines, bias circuit 15 is turned on to output the power supply voltage Vdd to the node BLCRL, and clamping transistor Q1 is turned on simultaneously with BLCLP=Vsg.

At timing t3, raise select signals BLSe and BIASo, and start the bit line charging operation. Non-selected bit lines, BLo, are charged up to Vdd via select gate transistors ST4 driven by BIASo=Vreadh (where, Vreadh is a voltage that is able to transfer Vdd without Vth drop). Selected bit lines, BLe, are biased in accordance with program data.

That is, a "1"-program bit line (the solid bit line BLe in FIG. 5, to which "1" data is supplied) is set at Vdd while a "0"-program bit line (the dotted bit line BLe in FIG. 5, to which "0" data is supplied) is set at Vss. At this time, the cell's channels coupled to the "1"-program bit line and "0"-program bit line in the selected block are set at Vdd and Vss correspondingly to the "1"-program bit line and "0"-program bit line, respectively.

At timing t4, select signals BIASo and BLSe are pulled down once. As a result, bit lines BLe and BLo are temporarily isolated from sense amplifier S/A and bias circuit 15 to be set in a floating state.

FIG. 4 shows the bit line capacitance distributions in the biased state and the floating state. In the biased state, the sum of a capacitance component between just neighboring two bit lines and another capacitance component between neighboring two bit lines with one bit line interposed therebetween reaches 85% of the total bit line capacitance. By contrast, in the floating state, the above-described sum of two capacitance components become 0% apparently, and still another bit line capacitance component against cell source line CELSRC becomes large such as 35%.

In this embodiment, it is intended to boost the initially charged bit lines with this capacitive coupling from the cell source line CELSRC in a state that the bit lines are set in a floating state.

That is, after setting the bit lines to be in the floating state at timing t4, cell source line CELSRC is raised to the power supply voltage Vdd at timing t5. As a result, bit lines BLe and BLo are boosted by α (=Vdd×coupling ratio defined between the cell source line and the bit lines). Explaining in other words, "1"-program bit lines (i.e., program-inhibited bit lines), non-selected bit lines and cell's channels coupled thereto are boosted to Vdd+α.

After starting the cell source line driving, at timing t6, the select gate line SGD is pulled down at Vsgd slightly lower than Vsg (i.e., Vsgd is a level, with which the select gate transistor S1 is turned off with the bit line level Vdd. As a result, "1"-program cell's channels are isolated from the bit lines to be kept in the floating state of Vdd+α. Then, at timing t7, select signals BIASo and BLSe are raised again to Vreadh.

As a result, non-selected bit lines BLo are set at Vdd via bias circuit 15 while selected bit lines BLe are coupled to the sense amplifier circuit again to be set in accordance with program data as follows: "1"-program bit lines are set at Vdd; and "0"-program bit lines are set at Vss. At this time, "1"-program cell's channel is kept in the floating state of Vdd+α because the select gate transistor S1 is off; and "0"-program cell's channel is set at the same ground voltage Vss as the bit line through on-state select gate transistor S1.

At timing t8, a selected word line in the selected block is applied with boosted program voltage Vpgm, and non-selected word lines are applied with voltage-pass voltage Vpass (<Vpgm). In the "0"-program cell, a large voltage is applied between the floating gate and the cell's channel, and electrons are injected into the floating gate, so that the threshold voltage becomes high. By contrast, in the "1"-program cell (i.e., program-inhibited cell), electron injection does not occur because the floating cell's channel is boosted.

In a practical program sequence, program voltage applications and program-verify operations for verifying the programmed states are repeatedly performed. In this program sequence, a sufficiently "0"-programmed cell as a result of the program voltage application is set in the "1"-program data state (i.e., program-inhibited state) hereinafter while an insufficiently "0"-programmed cell is set to be in the "0"-program data state again. Under such program sequence control, it will be judged that the data program is completed when the program data held in the sense amplifier circuit result in an all "1" state.

As described above, according to this embodiment, it becomes possible at the beginning of the program sequence to boost the program-inhibited bit lines and non-selected bit lines in the selected bit lines, and cell's channels coupled to these bit lines to be higher than the power supply voltage Vdd by use of capacitive coupling from the sell source line CELSRC without additional boost circuit.

In the NAND-type flash memory used in reset years, the total bit line capacitance of selected bit lines in one page to be programmed simultaneously (i.e., this is equal to the total bit line capacitance of non-selected bit lines) is five times or more larger or ten times or more larger than that of the source line. Under this condition, if it is adapted such a method as to boost the selected bit lines by capacitive coupling from the non-selected bit lines, it will take a long time for initially charging the cell's channels.

As described in the embodiment, to use the capacitive coupling from the sell source line, it is preferable for performing the cell's channel initial charging operation in a short time. Explaining in other words, this embodiment is effective in such a NAND-type flash memory that the total bit line capacitance of the simultaneously selected bit lines (assuming that the simultaneously selected bit lines are half of the whole bit lines) is five times or more larger, or ten times or more larger than that of the source line. Furthermore, this embodiment is effective in a case where the power supply voltage is equal to or lower than Vdd=2.5V, and specifically effective in case Vdd is equal to or lower than 1.8V.

The sense amplifier S/A shown in FIG. 3 is an example, and it should be noted that suitable changes may be adapted to the configuration if the same operation as explained in FIG. 5 is achieved.

The bit line control method shown in FIG. 5 also is an example. Therefore, suitable changes may be adapted to the method under the condition that the same operation is achieved as in FIG. 5, i.e., the bit lines are boosted via the cell source line after these are set in a floating state.

[Application Devices]

As another embodiment, an electric card using the non-volatile semiconductor memory devices according to the above-described embodiment and an electric device using the card will be described bellow.

Figure 7:
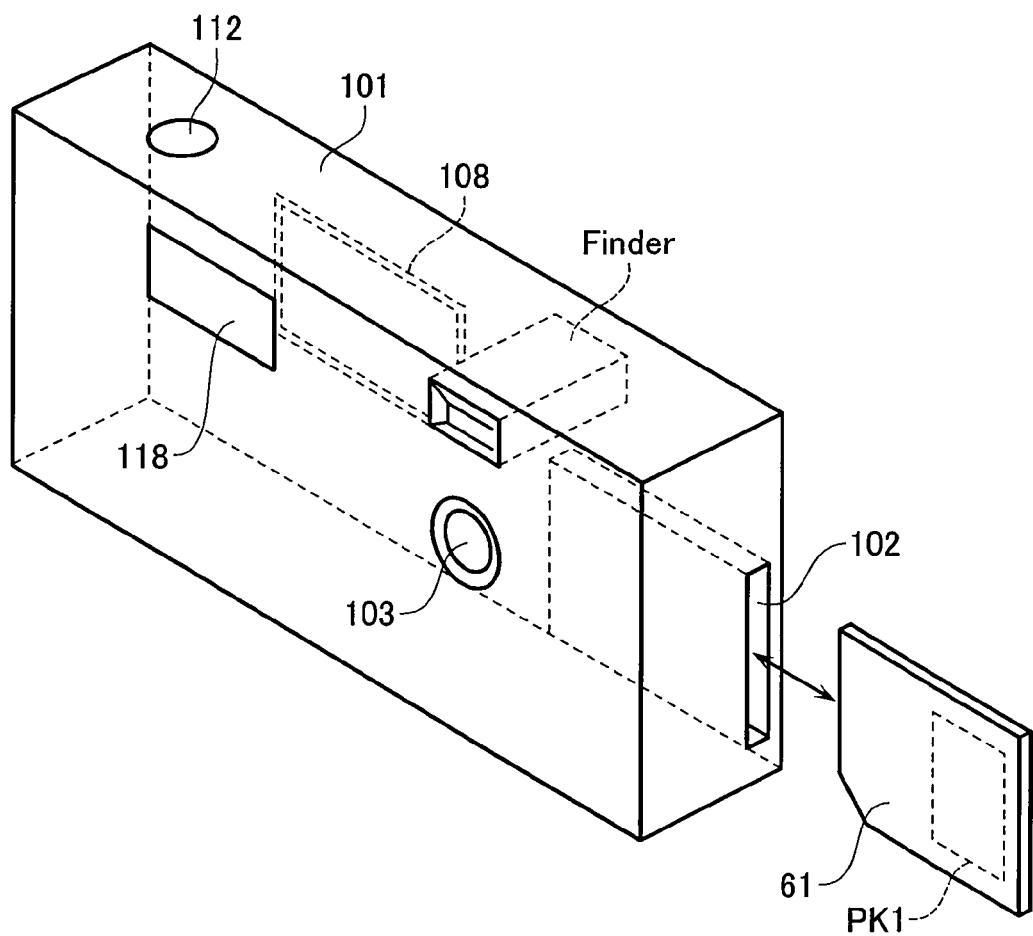
FIG. 7 shows another embodiment applied to a digital still camera.

FIG. 7 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 8:
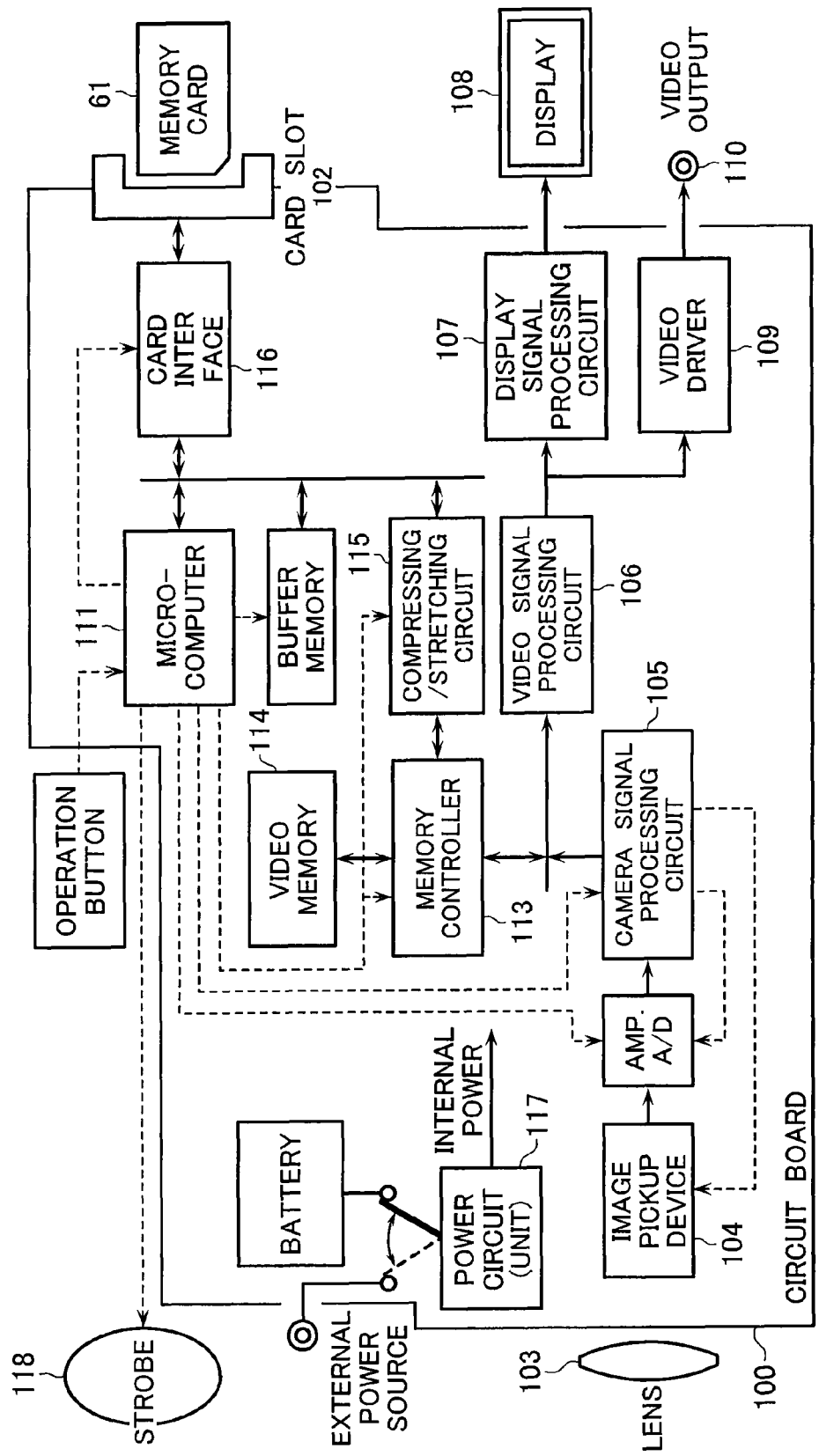
FIG. 8 shows the internal configuration of the digital still camera.
Figure 9A:
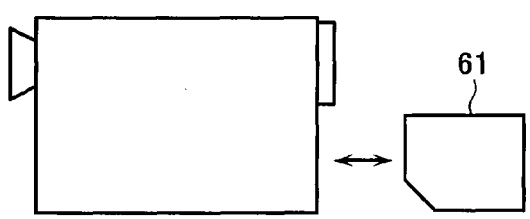
FIGS. 9A to 9J show other electric devices to which the embodiment is applied.
Figure 9F:
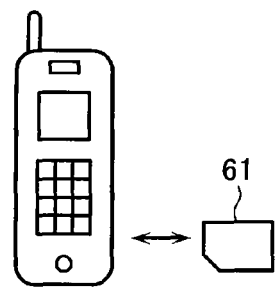
Figure 9B:
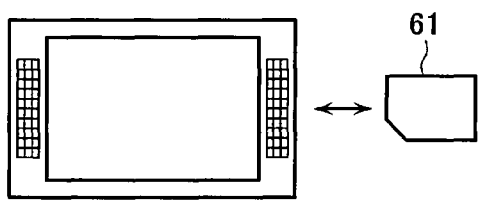
Figure 9G:
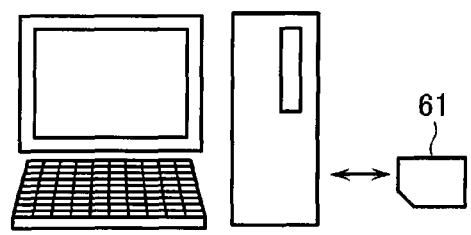
Figure 9C:
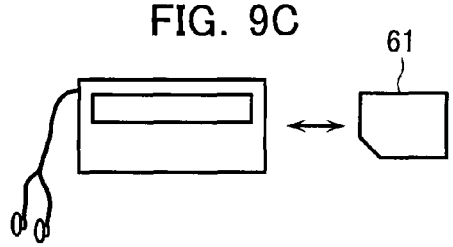
Figure 9H:
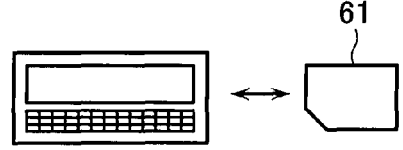
Figure 9D:
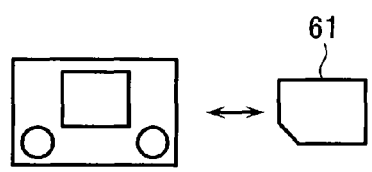
Figure 9I:
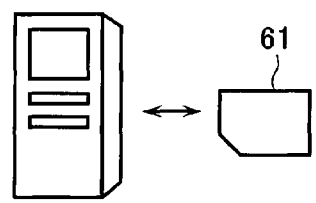
Figure 9E:
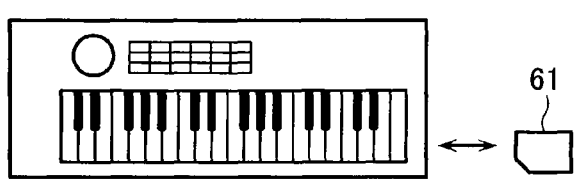
Figure 9J:
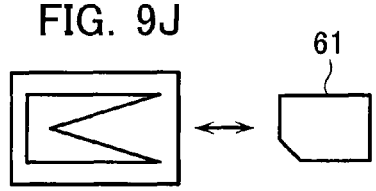

FIG. 8 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 9A to 9J, as well as in portable electric devices. That is, the electric card can also be used in a video camera shown in FIG. 9A, a television set shown in FIG. 9B, an audio apparatus shown in FIG. 9C, a game apparatus shown in FIG. 9D, an electric musical instrument shown in FIG. 9E, a cell phone shown in FIG. 9F, a personal computer shown in FIG. 9G, a personal digital assistant (PDA) shown in FIG. 9H, a voice recorder shown in FIG. 9I, and a PC card shown in FIG. 9J.

While certain embodiments have been described, these embodiments have been presented by way of example only, and are not intended to limit the scope of the inventions. Indeed, the novel devices and methods described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising a cell array with NAND strings arranged therein, one ends of the NAND strings being coupled to bit lines while the other ends are coupled in common to a cell source line, each NAND string having electrically rewritable and non-volatile memory cells connected in series, wherein
the semiconductor memory device has such a program mode that the bit lines and cell's channels of the NAND strings coupled thereto are initially charged in accordance with program data, and then program voltage is applied to the memory cells selected in the cell array, and wherein
in the program mode, a certain bit line and a program-inhibited cell's channel coupled thereto, which are initially charged to the power supply voltage, are boosted to be higher than the power supply voltage by capacitive coupling from the cell source line prior to the program voltage application.

2. The semiconductor memory device according to claim 1, further comprising a sense amplifier circuit configured to store one page of program data or read data, which are transferred between the sense amplifier circuit and the cell array in a lump.

3. The semiconductor memory device according to claim 2, wherein
in the program mode, a program bit line and a cell's channel coupled thereto and a program-inhibited bit line and a cell's channel coupled thereto are initially charged at the ground voltage "Vss" and the power supply voltage "Vdd", respectively, in accordance with program data supplied from the sense amplifier circuit; and the initially charged program-inhibited bit line and cell's channel coupled thereto are set in such a floating state that the sense amplifier circuit is isolated from the bit lines, and then boosted to be higher than "Vdd" by capacitive coupling from the cell source line applied with the power supply voltage "Vdd".

4. The semiconductor memory device according to claim 1, wherein
the total bit line capacitance of the bit lines simultaneously selected in the program mode is five times or more than that of the cell source line.

5. The semiconductor memory device according to claim 1, wherein
the power supply voltage is equal to or lower than 2.5V.

6. The semiconductor memory device according to claim 1, wherein
the power supply voltage is equal to or lower than 1.8V.

7. A method of programming a semiconductor memory device, the semiconductor memory device having a cell array, in which electrically rewritable and non-volatile memory cells are connected in series to constitute a NAND string, control gates of the memory cells in the NAND string being coupled to different word lines, one ends of the NAND strings being coupled to different bit lines while the other ends are coupled in common to a cell source line, comprising:
initially charging a "0"-program bit line and a cell's channel coupled thereto and a "1"-program bit line and a cell's channel coupled thereto at a first voltage and a second voltage higher than the first voltage, respectively, in accordance with program data supplied from a sense amplifier circuit;
driving the cell source line in such a state that the sense amplifier circuit are temporarily isolated from the bit lines, thereby boosting the "1"-program bit line and the cell's channel coupled thereto to a third voltage higher than the second voltage by capacitive coupling from the cell source line; and
applying program voltage to one selected in the word lines in such a state that the sense amplifier circuit is coupled again to the bit lines.

8. The method according to claim 7, wherein
the first voltage and the second voltage are ground voltage "Vss" and power supply voltage "Vdd", respectively; and the third voltage is "Vdd+α" (where, α is boosted voltage defined by capacitive coupling ratio between the cell source line and the bit lines).

9. The method according to claim 7, wherein the NAND strings are coupled to the bit lines via select gate transistors, and wherein
the initial charging of the "0"- and "1"-program bit lines and cell's channels coupled thereto is performed in such a state that the select gate transistors are on-driven to transfer data without threshold voltage drop; and
the gate level of the select gate transistors is so pulled down as to keep the cell's channel corresponding to the "1"-program bit line in a floating state after starting the cell source line driving and before the sense amplifier circuit is coupled again to the bit lines.

10. The method according to claim 7, wherein
in the cell array, the total bit line capacitance of the bit lines simultaneously selected in the program mode is five times or more than that of the cell source line.

11. The method according to claim 8 wherein
the power supply voltage "Vdd" of the semiconductor memory device is equal to or lower than 2.5V.

12. The method according to claim 8, wherein
the power supply voltage "Vdd" of the semiconductor memory device is equal to or lower than 1.8V.

* * * * *